United States Patent
Jo et al.

(10) Patent No.: US 12,101,070 B2
(45) Date of Patent: *Sep. 24, 2024

(54) METHOD AND SYSTEM FOR PROCESSING AUDIO SIGNAL

(71) Applicants: NAVER CORPORATION, Seongnam-si (KR); GAUDIO LAB, INC., Seoul (KR)

(72) Inventors: Seongcheol Jo, Seongnam-si (KR); Taek Su An, Seongnam-si (KR); Sung Hyun Kang, Seongnam-si (KR); JiUng Lee, Seongnam-si (KR); Byung Gyou Choi, Seongnam-si (KR); Jeongsoo Hur, Seongnam-si (KR); Jeonghun Seo, Seoul (KR); Sang Bae Chon, Seoul (KR); Hyun Oh Oh, Seongnam-si (KR)

(73) Assignees: NAVER CORPORATION, Seongnam-si (KR); GAUDIO LAB, INC., Seoul (KR)

( * ) Notice: Subject to any disclaimer, the term of this patent is extended or adjusted under 35 U.S.C. 154(b) by 194 days.

This patent is subject to a terminal disclaimer.

(21) Appl. No.: 17/808,321

(22) Filed: Jun. 23, 2022

(65) Prior Publication Data

US 2022/0321076 A1 Oct. 6, 2022

Related U.S. Application Data

(63) Continuation of application No. PCT/KR2020/019071, filed on Dec. 24, 2020.

(30) Foreign Application Priority Data

Dec. 26, 2019 (KR) .......................... 10-2019-0174676

(51) Int. Cl.
*H03G 7/00* (2006.01)
*H03G 3/00* (2006.01)
(Continued)

(52) U.S. Cl.
CPC .............. *H03G 7/007* (2013.01); *H03G 3/002* (2013.01); *H03G 3/32* (2013.01); *H03G 5/005* (2013.01)

(58) Field of Classification Search
CPC .......... H03G 3/002; H03G 3/32; H03G 5/005; H03G 7/007; H04N 21/233; H04N 21/435;
(Continued)

(56) References Cited

U.S. PATENT DOCUMENTS

2014/0294200 A1* 10/2014 Baumgarte ........... G10L 19/008
381/107
2015/0245153 A1* 8/2015 Malak ....................... H04S 7/30
381/57
(Continued)

FOREIGN PATENT DOCUMENTS

KR 1020150036581 A 4/2015
KR 1020150122760 A 11/2015
(Continued)

OTHER PUBLICATIONS

C. Loudness Normalization Pt.2; https://blog.naver.com/satusfree5/221171053395; Dec. 26, 2017; pp. 1-13.
(Continued)

*Primary Examiner* — Lun-See Lao
(74) *Attorney, Agent, or Firm* — Greer Burns & Crain Ltd.

(57) ABSTRACT

A method for processing an audio signal includes setting target loudness; receiving metadata of an audio signal from a server; and adjusting the loudness of the audio signal by
(Continued)

using the received metadata, so that the loudness of the audio signal corresponds to the set target loudness.

17 Claims, 7 Drawing Sheets

(51) Int. Cl.
*H03G 3/32* (2006.01)
*H03G 5/00* (2006.01)

(58) Field of Classification Search
CPC ............. H04N 21/439; H04N 21/4394; H04N 21/485; H04N 21/4852
USPC ..................................... 381/104–107; 700/94
See application file for complete search history.

(56) References Cited

U.S. PATENT DOCUMENTS

| | | | | |
|---|---|---|---|---|
| 2015/0332685 | A1* | 11/2015 | Bleidt | ............... G10L 19/26 |
| | | | | 704/500 |
| 2017/0098452 | A1* | 4/2017 | Tracey | ............... G10L 19/26 |
| 2018/0322890 | A1* | 11/2018 | Riedmiller | ............ G10L 19/008 |

FOREIGN PATENT DOCUMENTS

| | | |
|---|---|---|
| KR | 1020160083675 A | 7/2016 |
| KR | 1020160125511 A | 10/2016 |
| KR | 1020190125219 A | 11/2019 |

OTHER PUBLICATIONS

ISR issued in PCT/KR2020/019071, mailed May 3, 2021.

* cited by examiner

METHOD AND SYSTEM FOR PROCESSING AUDIO SIGNAL

CROSS-REFERENCE TO RELATED APPLICATIONS

This is a continuation application of International Application No. PCT/KR2020/019071, filed Dec. 24, 2020, which claims the benefit of Korean Patent Application No. 10-2019-0174676, filed Dec. 26, 2019.

BACKGROUND OF THE INVENTION

Field of Invention

One or more example embodiments of the present invention in following description relate to a method and system for processing an audio signal and, more particularly, to an audio signal processing method and system for providing a higher quality audio signal to a user using a media service including an audio of a broadcast, a streaming, and the like.

Description of Related Art

There are services (e.g., a service for streaming of music, video, etc.) for receiving and enjoying contents including audio through a network. For example, Korean Patent Laid-Open Publication No. 10-2016-0083675 relates to a method of providing live streaming content and describes that live streaming content may be more quickly provided without a delay by caching remaining chunk files, excluding the first chunk file, from live streaming content including a plurality of chunk files before a terminal requests the same.

As mainstream audio technology changes from analog to digital, a wider volume may be expressed and a volume of content also tends to vary. Since a target volume may differ in a content production process, standards announced by international standard organizations such as International Telecommunication Union (ITU) and European Broadcasting Union (EBU) are not being implemented well in reality. Also, there is an issue in that it is difficult to directly use corresponding information since a method and a standard for measuring a corresponding loudness may be different for each country. In addition, there is a trend for forming a competition structure called a loudness war in which a content creator provides a user with content that is mixed in a louder volume depending on psychoacoustic characteristics that sound quality is perceived as being good when a volume increases. As a result, a user suffers from the inconvenience of having to adjust the volume frequently due to the different volume levels between contents or in content. For example, after enjoying first content to which the loudness of first magnitude is set, second content to which the loudness of second magnitude is set may be played back. In this case, if the second magnitude is relatively too large or too small compared to the first magnitude, a user may be inconvenienced to have to adjust the volume again or may feel discomfort due to the volume being too loud (or too low). The difference in volume between the contents may cause the user to feel a degradation in quality of service. Therefore, for convenience of an end user, there is a need for a solution for unifying contents of which target volume is not well maintained.

BRIEF SUMMARY OF THE INVENTION

Some example embodiments of the present invention provide an audio signal processing method and system that may solve inconvenience related to a volume perceivable by a user when providing audio or video content including the audio to the user.

According to at least one example embodiment, there is provided an audio signal processing method of a computer device including at least one processor, the audio signal processing method including setting, by the at least one processor, a target loudness; receiving, by the at least one processor, metadata of an audio signal from a server; and adjusting, by the at least one processor, a loudness of the audio signal such that the loudness of the audio signal corresponds to the set target loudness using the received metadata. The received metadata includes an outlier bounce back (OBB) offset value to compensate for a difference value between an integrated loudness and the target loudness calculated to adjust the loudness of the audio signal, and the adjusting the loudness of the audio signal includes adjusting the loudness based on the OBB offset value.

According to an aspect of the present invention, the adjusting of the loudness of the audio signal may include calculating the difference between the integrated loudness and the target loudness; and applying the difference value to the audio signal when the target loudness is less than or equal to the integrated loudness or when a difference between the target loudness and a reference loudness included in the metadata is less than or equal to an OBB threshold.

According to another aspect, the adjusting of the loudness of the audio signal may include calculating the difference value between the integrated loudness and the target loudness, and when the target loudness is greater than the integrated loudness and a difference between the target loudness and a reference loudness included in the metadata is greater than an OBB threshold, may further include applying the OBB offset value to the difference value; and applying the difference value to which the OBB offset value is applied to the audio signal.

According to still another aspect, the applying of the OBB offset value may include applying the OBB offset value to the difference value such that an application ratio of the OBB offset value applied to the difference value varies according to the target loudness.

According to still another aspect, the applying of the OBB offset value may include applying the OBB offset value to the difference value such that an application ratio of the OBB offset value applied to the difference value increases according to an increase in the target loudness.

According to still another aspect, the applying of the OBB offset value may include calculating an offset gain based on the target loudness; calculating a compensation value based on the offset gain and the OBB offset value; and applying the compensation value to the difference value.

According to still another aspect, the adjusting of the loudness of the audio signal may further include calculating an OBB threshold as a value for determining whether to apply a compensation of a loudness gain using the OBB offset value based on the target loudness.

According to still another aspect, the OBB offset value may be calculated by the server using a parameter used to calculate the loudness of the audio signal.

According to still another aspect, the parameter may include at least one of a section-by-section loudness for the audio signal, a loudness range (LRA), a true-peak, and a peak-to-loudness ratio (PLR).

According to at least one example embodiment, there is provided an audio signal processing method of a computer device including at least one processor, the audio signal processing method including calculating, by the at least one processor, an OBB offset value for compensation of a difference value between an integrated loudness and a target loudness calculated to adjust a loudness of an audio signal; calculating, by the at least one processor, a reference loudness; generating, by the at least one processor, metadata of the audio signal that includes the calculated OBB offset value and reference loudness; storing, by the at least one processor, the generated metadata; and providing, by the at least one processor, the stored metadata in response to a request from a client.

According to one aspect of the present invention, the calculating of the OBB offset value may include calculating the OBB offset value using a parameter used to calculate the loudness of the audio signal.

According to another aspect, the parameter may include at least one of a section-by-section loudness for the audio signal, an LRA, a true-peak, and a PLR.

According to still another aspect, the calculating of the reference loudness may include calculating a loudness to be measured when matching the loudness of the audio signal to a preset loudness as a reference loudness.

According to at least one example embodiment, there is provided a computer program stored in a computer-readable recording medium to implement the audio signal processing method in conjunction with a computer device.

According to at least one example embodiment, there is provided a computer-readable recording medium storing a program to implement the audio signal processing method in a computer device.

According to at least one example embodiment, there is provided a computer device including at least one processor configured to execute a computer-readable instruction. The at least one processor is configured to set a target loudness, to receive metadata of an audio signal from a server, and to adjust a loudness of the audio signal such that the loudness of the audio signal corresponds to the set target loudness using the received metadata.

According to at least one example embodiment, there is provided a computer device including at least one processor. The at least one processor is configured to calculate an OBB offset value for compensation of a difference value between an integrated loudness and a target loudness calculated to adjust a loudness of an audio signal, to calculate a reference loudness, to generate metadata of the audio signal that includes the calculated OBB offset value and reference loudness, to store the generated metadata, and to provide the stored metadata in response to a request from a client.

According to some example embodiments, it is possible to solve inconvenience related to a volume perceivable by a user when providing audio or video content including the audio to the user.

DETAILED DESCRIPTION OF THE INVENTION

Hereinafter, some example embodiments will be described with reference to the accompanying drawings.

An audio signal processing system according to the example embodiments may be implemented by a plurality of computer devices and an audio signal processing method according to the example embodiments may be performed by at least one computer device included in the audio signal processing system. In an example embodiment, the audio signal processing system may include a computer device that implements a server and a computer device that implements a client. Here, the computer device that implements the server may perform an audio signal processing method performed by the server and the computer device that implements the client may perform an audio signal processing method performed by the client. A computer program according to an example embodiment may be installed and executed on the computer device, and the computer device may perform the method according to the example embodiments under the control of the executed computer program. The aforementioned computer program may be stored in a computer-readable storage medium to computer-implement the method in conjunction with the computer device.

Figure 1:
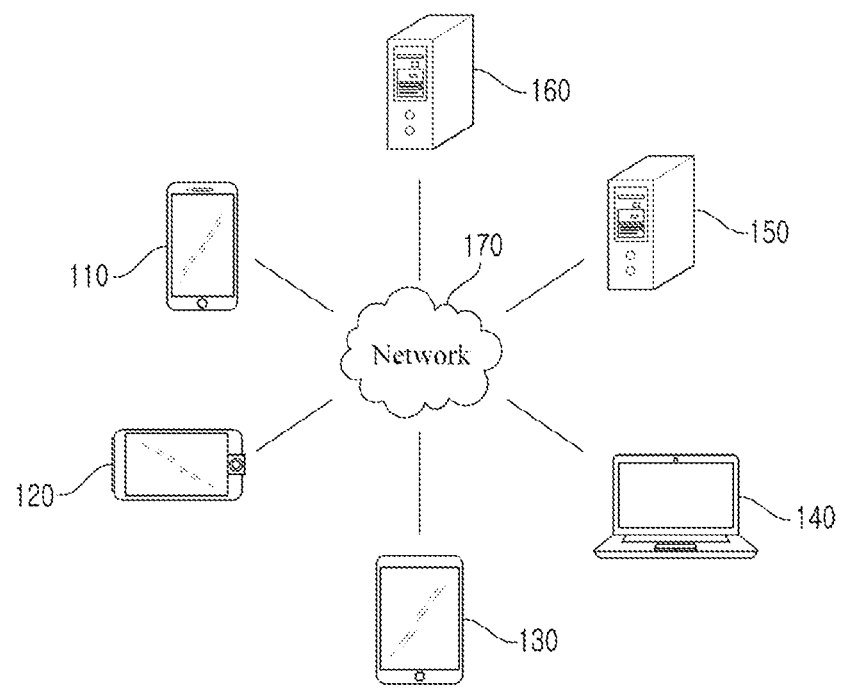
FIG. 1 is a diagram illustrating an example of a network environment according to an example embodiment.

FIG. 1 illustrates an example of a network environment according to an example embodiment. Referring to FIG. 1, the network environment may include a plurality of electronic devices 110, 120, 130, and 140, a plurality of servers 150 and 160, and a network 170. FIG. 1 is provided as an example only. The number of electronic devices or the number of servers is not limited thereto. Also, the network environment of FIG. 1 is provided as an example only among environments applicable to the example embodiments and the environment applicable to the example embodiments is not limited to the network environment of FIG. 1.

Each of the plurality of electronic devices 110, 120, 130, and 140 may be a fixed terminal or a mobile terminal that is configured as a computer device. For example, the plurality of electronic devices 110, 120, 130, and 140 may be a smartphone, a mobile phone, a navigation device, a computer, a laptop computer, a digital broadcasting terminal, a personal digital assistant (PDA), a portable multimedia player (PMP), a tablet personal computer (PC), and the like. For example, although FIG. 1 illustrates a shape of a smartphone as an example of the electronic device 110, the electronic device 110 used herein may refer to one of various types of physical computer devices capable of communicating with other electronic devices 120, 130, and 140 and/or the servers 150 and 160 over the network 170 in a wireless or wired communication manner.

The communication scheme is not limited and may include a near field wireless communication scheme between devices as well as a communication scheme using a communication network (e.g., a mobile communication network, wired Internet, wireless Internet, and a broadcasting network) includable in the network 170. For example, the network 170 may include at least one of network topologies that include a personal area network (PAN), a local area network (LAN), a campus area network (CAN), a metropolitan area network (MAN), a wide area network (WAN), a broadband network (BBN), and the Internet. Also, the network 170 may include at least one of network topologies that include a bus network, a star network, a ring network, a mesh network, a star-bus network, a tree or hierarchical network, and the like. However, they are provided as examples only.

Each of the servers 150 and 160 may be configured as a computer device or a plurality of computer devices that provides an instruction, a code, a file, content, a service, etc., through communication with the plurality of electronic devices 110, 120, 130, and 140 over the network 170. For example, the server 150 may be a system that provides a service (e.g., a content providing service, a group call service (or an audio conference service), a messaging service, a mail service, a social network service, a map service, a translation service, a financial service, a payment service, a search service, etc.) to the plurality of electronic devices 110, 120, 130, and 140 connected over the network 170.

Figure 2:
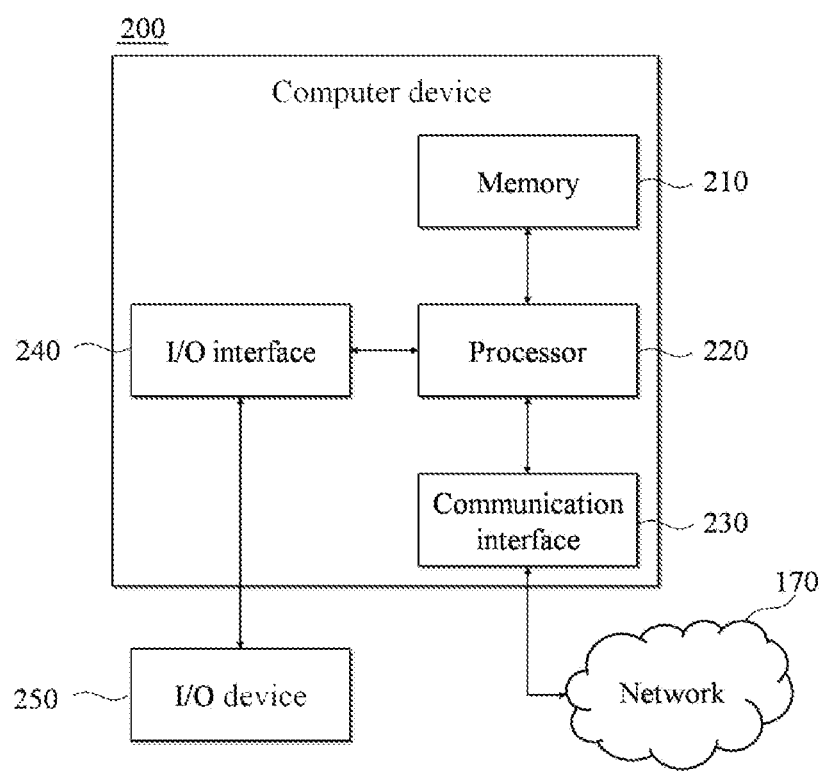
FIG. 2 is a block diagram illustrating an example of a computer device according to an example embodiment.

FIG. 2 is a block diagram illustrating an example of a computer device according to an example embodiment. Each of the plurality of electronic devices 110, 120, 130, and 140 of FIG. 1 or each of the servers 150 and 160 may be implemented by a computer device 200 of FIG. 2.

Referring to FIG. 2, the computer device 200 may include a memory 210, a processor 220, a communication interface 230, and an input/output (I/O) interface 240. The memory 210 may include a permanent mass storage device, such as a random access memory (RAM), a read only memory (ROM), and a disk drive, as a computer-readable recording medium. A permanent mass storage device, such as ROM and a disk drive, may be included in the computer device 200 as a permanent storage device separate from the memory 210. Also, an OS and at least one program code may be stored in the memory 210. Such software components may be loaded to the memory 210 from another computer-readable recording medium separate from the memory 210, for example, from a floppy drive, a disk, a tape, a DVD/CD-ROM drive, a memory card, etc. According to other example embodiments, software components may be loaded to the memory 210 through the communication interface 230, instead of the computer-readable recording medium. For example, the software components may be loaded to the memory 210 of the computer device 200 based on a computer program installed by files received over the network 170.

The processor 220 may be configured to process instructions of a computer program by performing basic arithmetic operations, logic operations, and I/O operations. The instructions may be provided from the memory 210 or the communication interface 230 to the processor 220. For example, the processor 220 may be configured to execute received instructions in response to the program code stored in the storage device, such as the memory 210.

The communication interface 230 may provide a function for communication between the communication apparatus 200 and another apparatus (e.g., the aforementioned storage devices) over the network 170. For example, the processor 220 of the computer device 200 may deliver a request or an instruction created based on a program code stored in the storage device such as the memory 210, data, and a file, to other apparatuses over the network 170 under the control of the communication interface 230. Inversely, a signal, an instruction, data, a file, etc., from another apparatus may be received at the computer device 200 through the network 170 and the communication interface 230 of the computer device 200. For example, a signal, an instruction, data, etc., received through the communication interface 230 may be delivered to the processor 220 or the memory 210, and a file, etc., may be stored in a storage medium (e.g., the permanent storage device) further includable in the computer device 200.

The I/O interface 240 may be a device used for interfacing with an I/O device 250. For example, an input device of the I/O device 250 may include a device, such as a microphone, a keyboard, a mouse, etc., and an output device of the I/O device 250 may include a device, such as a display, a speaker, etc. As another example, the I/O interface 240 may be a device for interfacing with an apparatus in which an input function and an output function are integrated into a single function, such as a touchscreen. The I/O device 250 may be configured as a single apparatus with the computer device 200.

Also, according to other example embodiments, the computer device 200 may include greater or less number of components than the number of components shown in FIG. 2. For example, the computer device 200 may include at least a portion of the I/O device 250, or may further include other components, for example, a transceiver, a database, etc.

Figure 3:
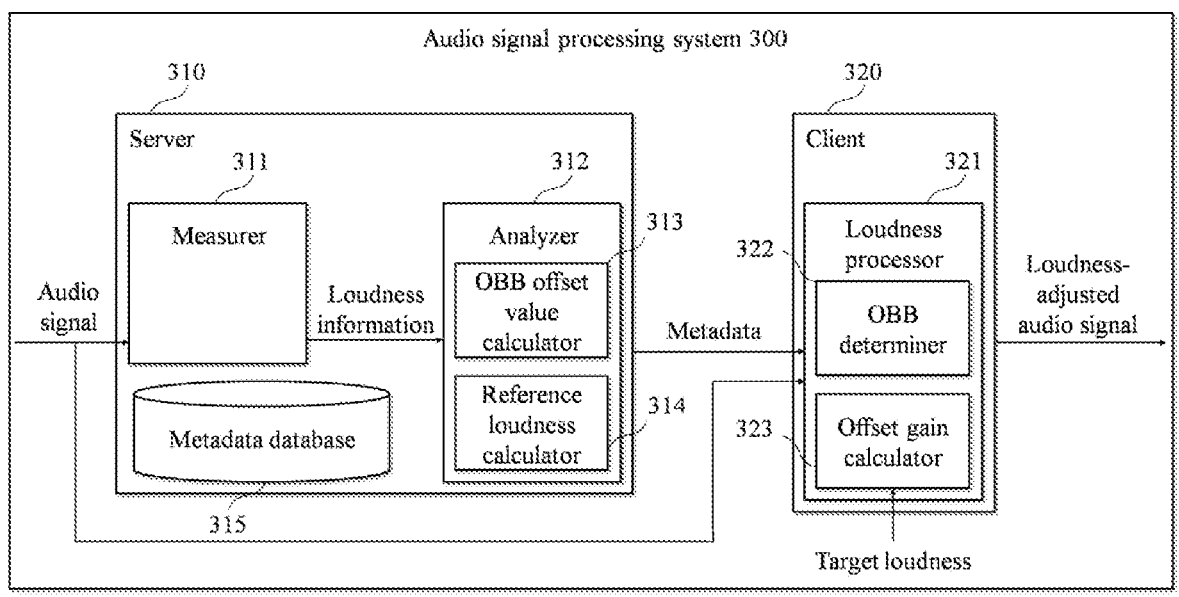
FIG. 3 is a block diagram of an audio signal processing system according to an example embodiment.

FIG. 3 illustrates an example of an audio signal processing system according to an example embodiment. An audio signal processing system 300 according to the example embodiment may include a server 310 and a client 330. Here, each of the server 310 and the client 330 may be implemented in the computer device 200.

The server 310 may measure the loudness of an audio signal and may generate metadata to be delivered to the client 320 based on the measured loudness. For example, the server 310 may include a measurer 311 configured to measure the loudness of the input audio signal and an analyzer 312 configured to receive the loudness measured by the measurer 311 and to generate the metadata. Also, the analyzer 312 may include an outlier bounce back (OBB) offset value calculator 313 and a reference loudness calculator 314. Here, the measurer 311, the analyzer 312, the outlier bounce back (OBB) offset value calculator 313, and the reference loudness calculator 314 may be functional expressions of operations performed by the processor 220 of the computer device 200 according to a computer program.

The measurer 311 may analyze the input audio signal and may collect loudness information. The loudness information may include at least one of the loudness for the entire audio signal, the loudness for a short section, the loudness for a moment, and the loudness for a content group and a channel. Also, a filter considering a human hearing characteristic may be used to measure the loudness. The filter may use an inverse filter of equal loudness contour or a K-weighting filter that approximates the same. The loudness for the moment may mean the loudness of an arbitrary moment among the entire audio signal.

The analyzer 312 may remove unnecessary information based on the acquired loudness information and may generate metadata for the loudness in a form of syntax that the client 320 may understand. In the process of generating the metadata, additional information of the audio signal, such as a genre, an artist, an album, and a channel, may be applied. For example, since sound sources from the same artist have similar sound characteristics in terms of style/timbre, it may be helpful to set the same target loudness. Also, it may be necessary to set a target loudness corresponding to a corresponding characteristic according to a characteristic of content. For example, a larger target loudness than that of metal music may be set to classical content. Also, since styles and standards for mixing/mastering sound vary according to characteristics of the times, a different target loudness may be applied at a point in time at which content is produced. Although the measurer 311 and the analyzer 312 are separately described in an example embodiment of FIG. 3, the measurer 311 and the analyzer 312 may be configured as a single component and thereby used.

The metadata may be stored in a metadata database 315 included in the server 310. In response to a request from the client 320, the server 310 may retrieve metadata corresponding to the requested audio signal from the metadata database 315 and may deliver the retrieved metadata to the client 320. In another embodiment, the metadata database 315 may be implemented in a separate device that communicates with the server 310 through the network 170.

The client 320 may generate a final output signal by receiving metadata for an audio signal to be played back from the server 310 and by adjusting the loudness of the audio signal such that an average loudness (an integrated loudness to be described below) of the audio signal may match a target loudness using the received metadata. For example, the client 320 may include a loudness processor 321 configured to adjust the loudness of the audio signal. The loudness processor 321 may include an OBB determiner 322 and an offset gain calculator 323. Here, the loudness processor 321, the OBB determiner 322, and the offset gain calculator 323 may be functional expressions of operations performed by the processor 220 of the computer device 200 according to a computer program.

The loudness processor 321 may generate the final output signal by multiplying the input audio signal by a gain corresponding to a difference between a target loudness of the audio signal to be output and the average loudness of the input audio signal. Additionally, the loudness processor 321 may adjust the audio signal before gain processing or the signal after gain processing using a module, such as a dynamic range compressor (DRC), a compressor, a limiter, and the like.

For example, in adjusting the loudness in the client 320, the loudness processor 321 may apply a gain value corresponding to a difference value to the input audio signal and may amplify the input audio signal when the loudness of the input audio signal is less than the target loudness. Here, due to a signal amplification, a clipping that a portion of the corresponding audio signal becomes greater than the maximum value of a discrete signal may occur. In this case, the client 320 may prevent the clipping using a DRC, a compressor, a limiter, and the like. However, when the clipping is prevented by applying the DRC, the compressor, the limiter, and the like, a portion of the output audio signal may become smaller than a desired state and may become smaller than an integrated loudness accordingly. To compensate for this, the loudness processor 321 may match the loudness of the output audio signal to the target loudness using the metadata delivered from the server 310.

To compensate for the loudness of the output audio signal to match the target loudness, the loudness processor 321 may apply an additional gain to the output audio signal using, for example, metadata of the audio signal delivered from the server 310. For example, to calculate the integrated loudness of the audio signal on the side of the server 310, the measurer 311 may calculate and output a momentary loudness for a short section of the audio signal. Here, the OBB offset value calculator 313 included in the analyzer 312 may receive the momentary loudness as an input, may calculate the integrated loudness, may calculate a reference value using the calculated integrated loudness, may generate an OBB offset value for compensation of a gain value based on the calculated reference value, and may include the generated OBB offset value in metadata. For example, the server 310 may calculate a reference loudness L_Ref measured when matching the loudness of an audio signal to aim at a preset loudness (e.g., −10 LKFS). Then, the server 310 may compare the reference loudness and the preset loudness and may set the OBB offset value to 0 under a specific condition (e.g., a difference of 1 or less). As a detailed example, the OBB offset value calculator 313 may set the OBB offset value to 0 if "|L_Ref−(−10)|<=1" and may calculate the OBB offset value as follows if "|L_Ref−(−10)|>1." Here, the condition "1" may vary depending on example embodiments.

Information used by the server 310 to generate the OBB offset value is not limited to the momentary loudness, and a short-term loudness, an LRA, a true-peak, and a PLR may be used in combination or alone. The following Equation 1 represents an example of calculating the OBB offset value.

$$\text{OBB offset} = \text{mean}(l\_j) - L\_I, \text{ where } l\_j \geq L\_I \qquad \text{[Equation 1]}$$

In Equation 1, L_I denotes an integrated loudness and l_j denotes a momentary loudness having a value greater than or equal to the integrated loudness L_I, among momentary loudnesses. That is, in the example embodiment, the OBB offset value may be calculated through a difference between an average of values greater than or equal to an integrated loudness value among momentary loudness values and the integrated loudness value. Although an example of calculating the OBB offset value using the integrated loudness and the momentary loudness is used in Equation 1, it is provided as an example only and a method of calculating the OBB offset value is not limited thereto. For example, the OBB offset value may be calculated through a difference between an average of true-peaks greater than or equal to an average-peak in a predetermined section and the average-peak. As described above, the OBB offset value may be calculated based on a difference between an average of values greater than or equal to the overall average value of a corresponding parameter and the overall average value in the corresponding parameter (one of a momentary loudness, a short-term loudness, an LRA, a true-peak, and a PLR) used to calculate the loudness of the audio signal. Alternatively, the OBB offset value may be calculated by a weighted sum of OBB offset values calculated by the respective plurality of parameters.

Here, the server 310 may generate metadata that includes the OBB offset value and the reference loudness, and may transmit the metadata to the client 320 in response to a request from the client 320. In addition to the OBB offset value and the reference loudness, the metadata may further include an integrated loudness, an LRA, and a PLR as basic loudness information.

As described above, the client 320 may adjust and output the loudness of the audio signal based on the metadata delivered from the server 310 and the preset target loudness. Here, when the target loudness is less than or equal to the integrated loudness of the input audio signal, the client 320 may generate a signal suitable for the target loudness by applying a linear gain value less than 1 without the need to perform a process of applying a DRC, a compressor, a limiter, and the like. Therefore, the client 320 may adjust and output the loudness of the audio signal without using the OBB offset value included in the received metadata.

Also, the client 320 may calculate and use an OBB threshold (hereinafter, OBB_th). Here, OBB_th refers to a value that determines whether to compensate for a loudness gain (a difference between the target loudness and the integrated loudness of the audio signal) using the OBB offset value and may be calculated based on a value of the target loudness. For example, the client 320 may calculate OBB_th such as "(target loudness+10)/3." In detail, the client 320 may use such OBB_th as a parameter to determine whether to apply the OBB offset value to the loudness gain. For example, when a difference (|L_T−L_Ref|) between a target loudness (L_T) and a reference loudness (L_Ref) included in metadata is less than or equal to OBB_th or when the target loudness (L_T) is less than or equal to the integrated loudness (L_I) (L_T<=L_I), the OBB determiner 322 included in the client 320 may set the OBB offset value to 0 such that the OBB offset value may not be applied.

On the contrary, when the target loudness (L_T) is greater than the integrated loudness (L_I) of the audio signal (L_T>L_I) and when the difference (|L_T−L_Ref|) between the target loudness (L_T) and the reference loudness (L_Ref) is greater than OBB_th, the client 320 may amplify the audio signal using a linear gain value greater than "1." In this case, a portion of the amplified audio signal may become larger than the value allowed in a discrete signal domain and a clipping may occur accordingly. In this case, as described above, a process of applying a DRC, a compressor, a limiter, and the like may be additionally performed. Here, the target loudness may be achieved by applying, to an amplification gain, the OBB offset value delivered as metadata to compensate for the loudness that decreases due to the DRC, the compressor, the limiter, and the like. In general, as the target loudness increases, a ratio of signals controlled by the DRC, the compressor, the limiter, and the like among the entire signals increases. Therefore, according to an increase in the target loudness, a larger OBB offset value may be applied. For example, the offset gain calculator 323 included in the client 320 may calculate the value of offset gain as in the following Equation 2.

$$\text{offset gain} = ((K + L\_T)/10)^{\wedge}(1/3) \quad \text{[Equation 2]}$$

In Equation 2, 'offset gain' denotes the offset gain and K denotes a constant.

The following Equation 3 represents an example in which the client 320 calculates a compensated gain value by applying the OBB offset value received from the server 310 and the offset gain calculated by the client 320.

$$\text{Compensated gain[dB]} = \text{sqrt}(2 \times \text{OBB offset}) \times \text{offset gain} \quad \text{[Equation 3]}$$

In Equation 3, 'Compensated gain' denotes the compensated gain value, 'OBB offset' denotes the OBB offset value received at the client 320 from the server 310, and 'offset gain' denotes the offset gain calculated by the client 320 through Equation 2. 'sqrt( )' denotes a function for acquiring a square root.

A method of calculating the offset gain of Equation 2 or a method of calculating the compensated gain value of Equation 3 is provided as an example only and the disclosure is not limited thereto.

The client 320 may calculate an additional offset gain that determines an application level of the OBB offset value from the target loudness and may generate and output the audio signal that achieves the target loudness by effectively responding to a change in the target loudness. For example, the client 320 may perform loudness compensation by applying the compensated gain value to the difference (L_T−L_I) between the target loudness and the integrated loudness. In this case, when the OBB offset value=0, the compensated gain value is 0. From this, it can be known that the loudness of the audio signal is not amplified.

Figure 4:
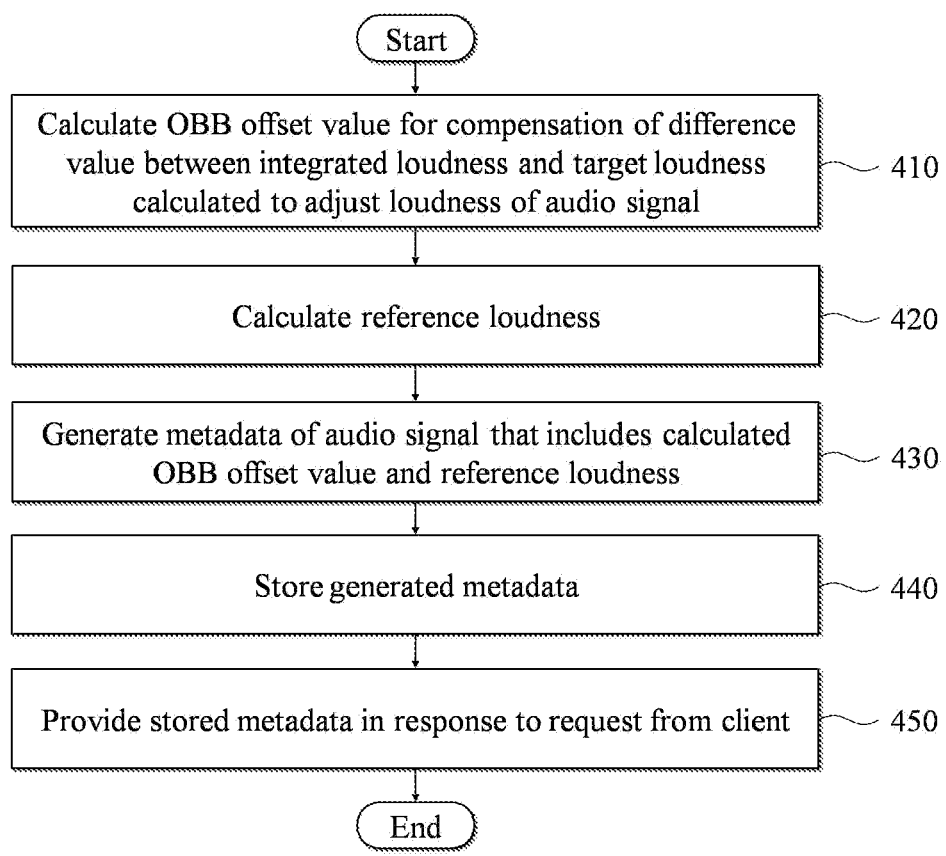
FIG. 4 is a flowchart illustrating an example of an audio signal processing method of a server according to an example embodiment.

FIG. 4 is a flowchart illustrating an example of an audio signal processing method of the server 310 according to an example embodiment. The audio signal processing method according to the example embodiment may be performed by the computer device 200 that implements the server 310. In this case, the processor 220 of the computer device 200 may be implemented to execute a control instruction according to a code of at least one computer program or a code of an OS included in the memory 210. Here, the processor 220 may control the computer device 200 to perform operations 410 to 450 included in the method of FIG. 4 according to a control instruction provided from a code stored in the computer device 200.

In operation 410, the server 310 may calculate an OBB offset value for compensation of a difference value between an integrated loudness and a target loudness calculated to adjust the loudness of an audio signal. For example, the client 320 may calculate the difference value between the integrated loudness and the target loudness and may adjust the loudness of the audio signal by applying the difference value to the audio signal. Here, the server 310 may calculate the OBB offset value that the client 320 may use to compensate for the difference value. In this case, the server 310 may calculate the OBB offset value using a parameter used to calculate the loudness of the audio signal. Here, the parameter used to calculate the loudness may include at least one of a section-by-section loudness for the audio signal, an LRA, a true-peak, and a PLR. For example, an example of calculating the OBB offset value using a momentary loudness that is the loudness of a short section is described above with reference to Equation 1.

In operation 420, the server 310 may calculate a reference loudness. For example, the server 310 may calculate the loudness to be measured when matching the loudness of the audio signal to a preset loudness as a reference loudness.

In operation 430, the server 310 may generate metadata of the audio signal that includes the calculated OBB offset value and reference loudness.

In operation 440, the server 310 may store the generated metadata. For example, the server 310 may store the generated metadata in the metadata database 315 included in the server 310 that is implemented by the server 310 or implemented in a separate device that communicates with the server 310 through the network 170. The server 310 may generate the metadata for each of audio signals related to a service provided from the server 310, and may store the generated metadata in the metadata database 315 in association with an identifier of a corresponding audio signal.

In operation 450, the server 310 may provide the stored metadata in response to a request from the client 320. For example, in response to a request that includes an identifier for identifying a specific audio signal from the client 320, the server 310 may extract metadata corresponding to the specific audio signal by searching the metadata database 315 through the corresponding identifier and may transmit the extracted metadata to the client 320 through the network 170.

The client 320 may adjust the loudness of the audio signal using the metadata provided from the server 310.

Figure 5:
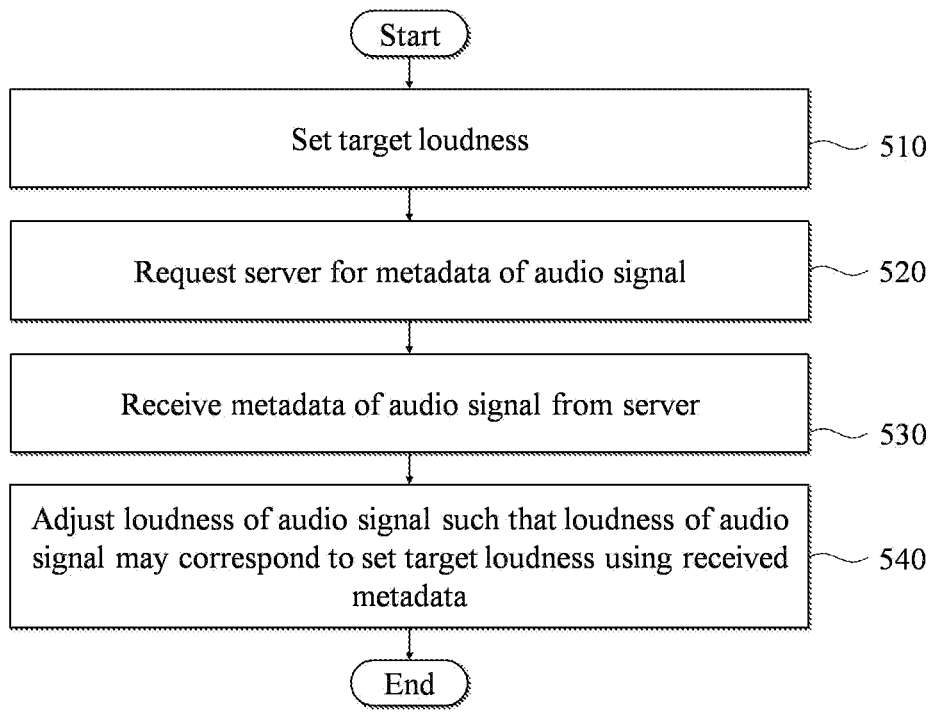
FIG. 5 is a flowchart illustrating an example of an audio signal processing method of a client according to an example embodiment.

FIG. 5 is a flowchart illustrating an example of an audio signal processing method of the client 320 according to an example embodiment. The audio signal processing method according to the example embodiment may be performed by the computer device 200 that implements the client 320. In this case, the processor 220 of the computer device 200 may be implemented to execute a control instruction according to a code of at least one computer program or a code of an OS included in the memory 210. Here, the processor 220 may control the computer device 200 to perform operations 510 to 540 included in the method of FIG. 5 according to a control instruction provided from a code stored in the computer device 200. Here, the at least one computer program may include an application (e.g., a media player app) that is installed and run on the computer device 200 to receive and play back content including audio from the server 310.

In operation 510, the client 320 may set a target loudness. The target loudness may be set by a user of the client 320 or may be preset by the client 320.

In operation 520, the client 320 may request the server 310 for metadata of an audio signal. For example, the client 320 may transmit a request for the metadata that includes the identifier of the audio signal to be played back to the server 310 over the network 170. As described above, the server 310 may extract metadata corresponding to the identifier of the audio signal from the metadata database 315 and may transmit the extracted metadata to the client 320.

In operation 530, the client 320 may receive the metadata of the audio signal from the server 310. When the server 310 transmits the metadata extracted from the metadata database 315 to the client 320, the computer device 200 that implements the client 320 may receive the metadata from the server 310 over the network 170.

In operation 540, the client 320 may adjust the loudness of the audio signal to correspond to the set target loudness using the received metadata. The client 320 may adjust the loudness of the audio signal by applying a difference value between an integrated loudness of the audio signal and the target loudness set in operation 510 to the audio signal. A process of adjusting the loudness of the audio signal is further described with reference to FIG. 6.

Figure 6:
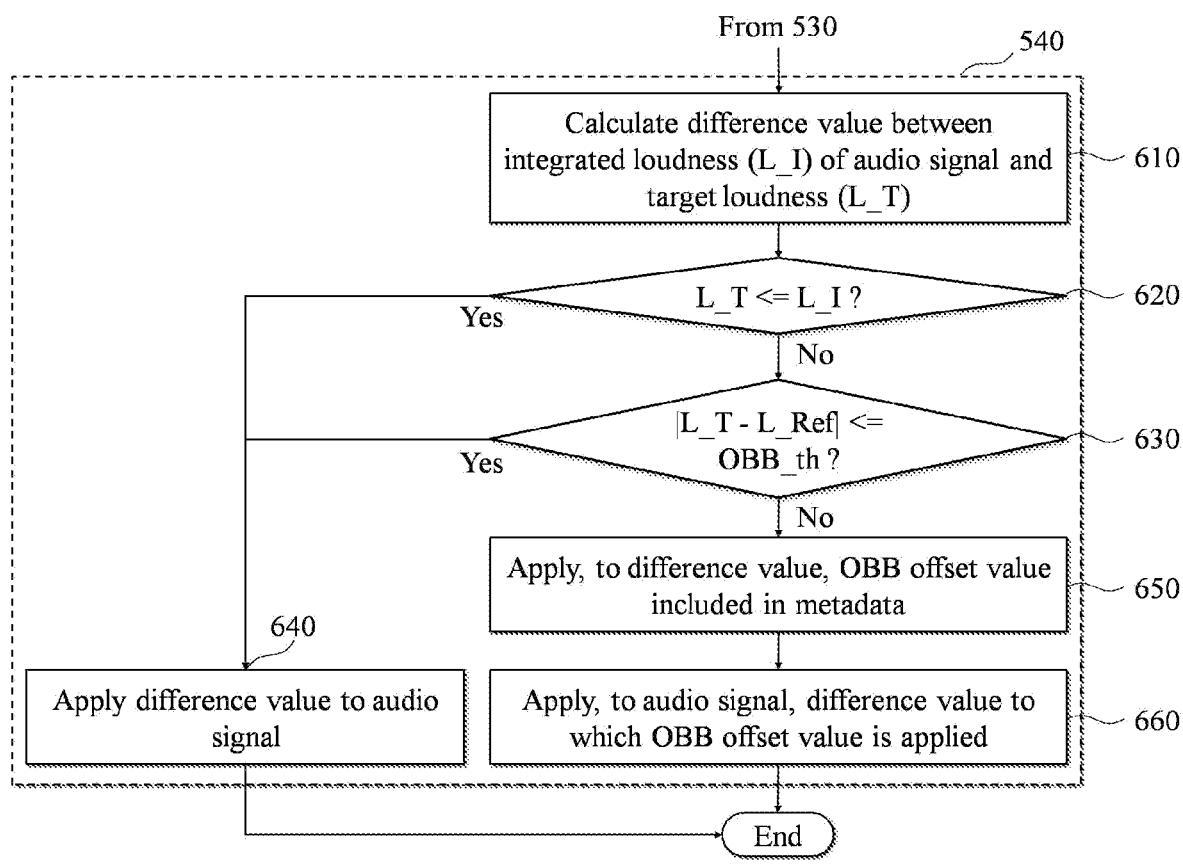
FIG. 6 is a flowchart of a process of adjusting the loudness of an audio signal according to an example embodiment.

FIG. 6 illustrates an example of a process of adjusting the loudness of an audio signal according to an example embodiment. Operations 610 to 650 according to an example embodiment of FIG. 6 may be included in operation 540 of FIG. 5 and performed by the client 320.

In operation 610, the client 320 may calculate the difference value between the integrated loudness of the audio signal and the target loudness. As described above, the client 320 may adjust the loudness of the audio signal by applying the difference value to the audio signal.

Here, the client 320 may determine whether to apply the difference value to the audio signal as is or whether to apply an OBB offset value to the difference value and then apply the difference value to the audio signal. Operations 620 and 630 may be processes for such determination. Here, an operation (not shown) of calculating an OBB threshold (OBB_th) used for such determination may be further included. For example, the computer device 200 may calculate the OBB threshold as an integrated loudness value when compensating for the audio signal with a goal of maximum loudness.

In operation 620, the client 320 may determine whether the target loudness (L_T) is less than or equal to the integrated loudness (L_I). Here, the client 320 may perform operation 640 when L_T is less than or equal to L_I and may perform operation 630 when L_T is greater than L_I.

In operation 630, the client 320 may determine whether a difference between the target loudness (L_T) and a reference loudness (L_Ref) is less than or equal to an OBB threshold (OBB_th). Here, the client 320 may perform operation 640 when L_T is less than or equal to L_Ref and may perform operation 650 when L_T is greater than L_Ref.

Although the order of operation 620 and operation 630 may be changed, the subsequent processes are still performed in the same manner.

In operation 640, the client 320 may apply the difference value to the audio signal. That is, when the target loudness (L_T) is less than or equal to the integrated loudness (L_I) or when the difference between the target loudness (L_T) and the reference loudness (L_Ref) included in the metadata is less than or equal to the OBB threshold, the client 320 may apply the difference value to the audio signal as is without applying the OBB offset value to the difference value.

In operation 650, the client 320 may apply, to the difference value, the OBB offset value included in the metadata. Here, the client 320 may apply the OBB offset value to the difference value such that an application ratio of the OBB offset value applied to the difference value may vary according to the target loudness (L_T). For example, the client 320 may apply the OBB offset value to the difference value such that an application ratio of the OBB offset value applied to the difference value may increase according to an increase in the target loudness.

In operation 660, the client 320 may apply, to the audio signal, the difference value to which the OBB offset value is applied. That is, when the target loudness (L_T) is greater than the integrated loudness (L_I) and when the difference between the target loudness (L_T) and the reference loudness (L_Ref) included in the metadata is greater than the OBB threshold, the client 320 may apply the OBB offset value to the difference value and then may apply the difference value to the audio signal.

Figure 7:
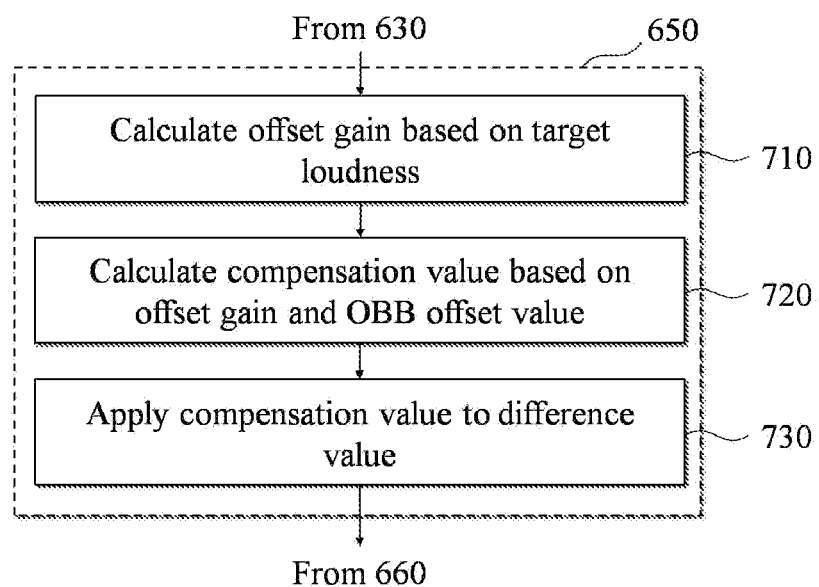
FIG. 7 is another flowchart of a process of adjusting the loudness of an audio signal according to an example embodiment.

FIG. 7 illustrates another example of a process of adjusting the loudness of an audio signal according to an example embodiment. Operations 710 to 730 according to the example embodiment of FIG. 6 may be included in operation 650 of FIG. 6 and performed by the client 320.

In operation 710, the client 320 may calculate an offset gain based on the target loudness. As an example, the offset gain is calculated through Equation 2.

In operation 720, the client 320 may calculate a compensation value based on the offset gain and the OBB offset value. As an example, the compensated gain value as the compensation value is calculated through Equation 3.

In operation 730, the client 320 may apply the compensation value to the difference value. Here, since the OBB offset value is applied to the compensation value, the OBB offset value may be applied to the difference value.

That is, since the offset gain is calculated based on the target loudness, an application ratio of the OBB offset value may be adjusted according to the target loudness. According to the example embodiment described above with reference to Equation 2 and Equation 3, it can be easily understood that the offset gain may increase according to an increase in the target loudness and the application ratio of the OBB offset value may increase according to an increase in the offset gain.

As described above, according to some example embodiments, it is possible to solve inconvenience related to a volume perceivable by a user when providing audio or video content including the audio to the user.

The systems or apparatuses described herein may be implemented using hardware components or a combination of hardware components and software components. For example, the apparatuses and the components described herein may be implemented using one or more general-purpose or special purpose computers or processing devices, for example, a processor, a controller, an arithmetic logic unit (ALU), a digital signal processor, a microcomputer, a field programmable gate array (FPGA), a programmable logic unit (PLU), a microprocessor, or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will be appreciated that a processing device may include multiple processing elements and/or multiple types of processing elements. For example, a processing device may include multiple processors or a processor and a controller. In addition, different processing configurations are possible, such as parallel processors.

The software may include a computer program, a piece of code, an instruction, or some combinations thereof, for independently or collectively instructing or configuring the processing device to operate as desired. Software and/or data may be embodied in any type of machine, component, physical equipment, virtual equipment, a computer storage medium or device, to be interpreted by the processing device or to provide an instruction or data to the processing device. The software also may be distributed over network coupled computer systems so that the software is stored and executed in a distributed fashion. The software and data may be stored by one or more computer readable storage media.

The methods according to the above-described example embodiments may be configured in a form of program instructions performed through various computer devices and recorded in computer-readable media. The media may include, in combination with program instructions or alone, data files, data structures, and the like. Here, the media may continuously store computer-executable programs or may transitorily store the same for execution or download. Also, the media may be various types of recording devices or storage devices in a form in which one or a plurality of hardware components are combined. Without being limited to media directly connected to a computer system, the media may be distributed over the network. Examples of the media include magnetic media such as hard disks, floppy disks, and magnetic tapes; optical media such as CD-ROM and DVDs; magneto-optical media such as floptical disks; and hardware devices that are configured to store program instructions, such as read-only memory (ROM), random access memory (RAM), flash memory, and the like. Examples of other media may include recording media and storage media managed by an app store that distributes applications or a site that supplies and distributes other various types of software, a server, and the like. Examples of a program instruction include a machine code as produced by a compiler and include a high-language code executable by a computer using an interpreter.

Although the example embodiments are described with reference to some specific example embodiments and accompanying drawings, it will be apparent to one of ordinary skill in the art that various alterations and modifications in form and details may be made in these example embodiments without departing from the spirit and scope of the claims and their equivalents. For example, suitable results may be achieved if the described techniques are performed in different order, and/or if components in a described system, architecture, device, or circuit are combined in a different manner, or replaced or supplemented by other components or their equivalents.

Therefore, other implementations, other example embodiments, and equivalents of the claims are to be construed as being included in the claims.

What is claimed is:

1. An audio signal processing method performed by a computer device having at least one processor, the method comprising:
   setting a target loudness;
   receiving metadata of an audio signal from a server; and
   adjusting a loudness of the audio signal such that the loudness of the audio signal corresponds to the set target loudness using the received metadata,
   wherein the received metadata includes an outlier bounce back (OBB) offset value to compensate for a difference value between an integrated loudness and the target loudness calculated to adjust the loudness of the audio signal, and
   the loudness of the audio signal is adjusted based on the OBB offset value.

2. The audio signal processing method of claim 1, wherein the adjusting of the loudness of the audio signal comprises:
   calculating the difference value between the integrated loudness and the target loudness; and
   applying the difference value to the audio signal when the target loudness is less than or equal to the integrated loudness or when a difference between the target loudness and a reference loudness included in the metadata is less than or equal to an OBB threshold.

3. The audio signal processing method of claim 1, wherein the adjusting of the loudness of the audio signal comprises:
   calculating the difference value between the integrated loudness and the target loudness, and
   when the target loudness is greater than the integrated loudness and a difference between the target loudness and a reference loudness included in the metadata is greater than an OBB threshold,
   applying the OBB offset value to the difference value; and
   applying the difference value to which the OBB offset value is applied to the audio signal.

4. The audio signal processing method of claim 3, wherein the OBB offset value is applied to the difference value such that an application ratio of the OBB offset value applied to the difference value varies according to the target loudness.

5. The audio signal processing method of claim 3, wherein the OBB offset value is applied to the difference value such that an application ratio of the OBB offset value applied to the difference value increases according to an increase in the target loudness.

6. The audio signal processing method of claim 3, wherein the applying of the OBB offset value comprises:
   calculating an offset gain based on the target loudness;
   calculating a compensation value based on the offset gain and the OBB offset value; and
   applying the compensation value to the difference value.

7. The audio signal processing method of claim 1, wherein the adjusting of the loudness of the audio signal further comprises calculating an OBB threshold as a value for determining whether to apply a compensation of a loudness gain using the OBB offset value based on the target loudness.

8. The audio signal processing method of claim 1, wherein the OBB offset value is calculated by the server using a parameter used to calculate the loudness of the audio signal.

9. The audio signal processing method of claim 8, wherein the parameter includes at least one of a section-by-section loudness for the audio signal, a loudness range (LRA), a true-peak, and a peak-to-loudness ratio (PLR).

10. An audio signal processing method performed by a computer device having at least one processor, the method comprising:

calculating an outlier bounce back (OBB) offset value for compensation of a difference value between an integrated loudness and a target loudness calculated to adjust a loudness of an audio signal;

calculating a reference loudness;

generating metadata of the audio signal that includes the calculated OBB offset value and the reference loudness; and storing the generated metadata, wherein the stored metadata is provided to a client in response to a request from a client to enable the client to adjust a loudness of the audio signal such that the loudness of the audio signal corresponds to a set target loudness using the received metadata including the OBB offset value.

11. The audio signal processing method of claim 10, wherein the OBB offset value is calculated using a parameter used to calculate the loudness of the audio signal.

12. The audio signal processing method of claim 11, wherein the parameter includes at least one of a section-by-section loudness for the audio signal, a loudness range (LRA), a true-peak, and a peak-to-loudness ratio (PLR).

13. The audio signal processing method of claim 10, wherein the calculating of the reference loudness comprises calculating a loudness to be measured when matching the loudness of the audio signal to a preset loudness as a reference loudness.

14. A non-transitory computer-readable recording medium storing a computer program for implementing the method claim 1 in a computer device.

15. A computer device comprising:

at least one processor configured to execute a computer-readable instruction, wherein the at least one processor is configured to, calculate an outlier bounce back (OBB) offset value for compensation of a difference value between an integrated loudness and a target loudness calculated to adjust a loudness of an audio signal, calculate a reference loudness, generate metadata of the audio signal that includes the calculated OBB offset value and the reference loudness, and store the generated metadata, wherein the stored metadata is provided to a client in response to a request from a client to enable the client to adjust a loudness of the audio signal such that the loudness of the audio signal corresponds to a set target loudness using the received metadata including the OBB offset value.

16. The computer device of claim 15, wherein the at least one processor is configured to calculate the OBB offset value using a parameter used to calculate the loudness of the audio signal.

17. The computer device of claim 15, wherein the at least one processor is configured to calculate a loudness to be measured when matching the loudness of the audio signal to a preset loudness as a reference loudness.

* * * * *